United States Patent
Oberhammer

[19]

[11] Patent Number: 6,037,846
[45] Date of Patent: Mar. 14, 2000

[54] SURFACE MOUNT EMI GASKET FILTER

[75] Inventor: Wolfgang Oberhammer, Ottawa, Canada

[73] Assignee: Nortel Networks Corporation, Montreal, Canada

[21] Appl. No.: 09/168,928

[22] Filed: Oct. 9, 1998

[51] Int. Cl.[7] .................................................. H03H 7/01
[52] U.S. Cl. ........................... 333/182; 333/12; 333/184; 174/35 GC; 361/818
[58] Field of Search ............................. 333/12, 182, 184, 333/185; 439/620; 174/35 GC; 361/302, 753, 816, 818

[56] References Cited

U.S. PATENT DOCUMENTS

| | | | |
|---|---|---|---|
| 4,739,453 | 4/1988 | Kurokawa | 361/816 |
| 4,747,019 | 5/1988 | Ito et al. | 361/816 |
| 4,950,185 | 8/1990 | Boutros | 439/620 |
| 5,550,713 | 8/1996 | Pressler et al. | 361/818 |
| 5,604,668 | 2/1997 | Wohrstein et al. | 361/816 |
| 5,620,476 | 4/1997 | Truex et al. | 607/36 |
| 5,621,363 | 4/1997 | Ogden et al. | 333/182 X |

FOREIGN PATENT DOCUMENTS

| | | | |
|---|---|---|---|
| 4-154102 | 5/1992 | Japan | 333/185 |

*Primary Examiner*—Justin P. Bettendorf

[57] ABSTRACT

A planar filter connector is disclosed for the transmission of signals to be passed in and out of an EMI shielded enclosure. The EMI enclosure has walls the free ends of which are provided with an electrically conductive, resilient gasket. The filter connector is located on a conductive pad on a printed circuit board and is positioned under a portion of one of the walls, the gasket being depressed to accommodate the filter connector. The connector consists of a planar conductor surrounded by high dielectric material and further surrounded by two planar metallization layers. One metallization layer is in electrical contact with the gasket and the other metallization layer is in contact with the conductive pad. Shielding through the connector is maintained by the capacitance created between the conductor and each of the metallization layers.

18 Claims, 5 Drawing Sheets

SURFACE MOUNT EMI GASKET FILTER

FIELD OF THE INVENTION

This invention relates to electro-magnetic interference (EMI) shielding of radio frequency (RF) electrical circuitry and shielded connectors for use in such shielding.

BACKGROUND OF THE INVENTION

Telecommunications products often make use of radio frequency (RF) signals in the megahertz frequency range to achieve cordless portability. Electronic circuits to permit the transmission and reception of such signals are known as RF circuits. Such circuits generate electro-magnetic interference (EMI) in the RF frequency range while in operation. The EMI generated by an RF circuit may interfere with the performance of other proximate RF or non-RF circuitry.

The degree of interference is related to the sensitivity of the proximate circuit to EMI, the operating frequency of the interfering RF circuit, the level of EMI generated by the interfering circuit and the proximity of the two circuits.

In cellular radios, both high frequency and high dynamic range is required. Receive signal power can be less than −100 dBm and oscillator and transmit signals may vary from 0 to 27 dBm. At such low power levels, circuits are very sensitive to EMI.

Generally, telecommunications products using RF frequency transmissions are constrained by regulatory requirements to operate along certain frequency bands. Furthermore, because of the requirement of portability, the size of such telecommunications products is kept as small as possible. This requires that the various circuits in such products be kept in close proximity, often on the same printed circuit board (PCB).

Accordingly, the potential that the performance of other circuits in the product will be impaired due to interference can be meaningfully reduced only by limiting the level of EMI to which these proximate circuits are exposed. Moreover, many jurisdictions now impose stringent regulatory maximum thresholds on the amount of EMI that an electronic device may radiate. Therefore, considerable efforts are expended to develop effective mechanisms to shield the RF circuitry in such products.

The concept of EMI shielding is based on the principle that a source of electro-magnetic energy may be contained by an electrically conductive enclosure. The completeness of the enclosure will govern the effectiveness of the containment of the EMI radiated by the source.

Ideally, therefore, an operating RF circuit may be completely shielded by completely enclosing the circuit in an electrically conductive case, such as a sealed metal box. However, as a practical matter, such a shielded circuit would be of little use as the RF transmissions which the circuit was designed to either transmit or receive would also be contained or excluded by the shield.

Thus, at a minimum, the desired RF signal to be transmitted or received must be permitted to escape or enter the EMI shield as the case may be. Moreover, an RF circuit typically requires power and control signal inputs, and/or generates control signal outputs. Therefore the EMI shield typically must permit a plurality of electrical connections across the shield boundary.

Furthermore, as indicated previously, size constraints on occasion dictate that the other circuitry in the telecommunications device co-exist on the same PCB, yet remain isolated from the radiated EMI of the RF circuitry. Therefore the EMI shield cannot as a practical matter be a solid conductive enclosure about the RF circuit to be shielded.

Previous approaches to effecting an EMI shield involved the combination of a metal conductive enclosure to surround a printed circuit board and the use of a plurality of connectors to pass signals beyond the boundaries of the enclosure.

To accommodate the co-existence of a plurality of circuits on the same PCB, the circuits were separated by a metallized boundary on both faces of the PCB, and the use of integral metal walls on both pieces of the enclosure which were vertically co-planar with the metal boundary strips when the enclosure was placed about the PCB. Periodically spaced vias were drilled through the metal boundaries and the PCB. Thus, when the enclosure was applied about the PCB, the gasket lining the walls on one of the enclosure components extended slightly through the vias into the PCB itself and into electrical contact with a gasket along the corresponding wall of the other piece of the enclosure. The effect of this enclosure system was to provide an effectively continuous conductive enclosure about each of the circuits separated by the metallized boundaries.

A plurality of shielded connectors was used in conjunction with this enclosure system as described above, to permit power and control signals to pass between circuits on the same PCB, from a circuit within a PCB to a circuit off the PCB.

Typically, passage of such signals has been effected by the use of a shielded connector comprising a suitable electrical connector bearing the signal to be passed across the zone boundary, and low pass filtering means at the zone boundary, whereby a capacitance is established from the conductor to the shield enclosure which is usually connected to electrical ground, and an impedance element in series between the conductor and the PCB where the signal to be passed appeared.

The impedance element would be either a resistor or an inductor or a combination of a resistor and inductor depending upon the nature of the signal to be passed, with the aim of minimizing the voltage drop across the impedance element. Thus, where the signal has a large DC current component one would prefer to use an inductor, while a resistor would be preferable for a control signal that does not require high current.

The interposition of a capacitor between the conductor and the electrically grounded enclosure provided a low impedance path at high frequencies so that any unwanted RF EMI will take the path of least resistance through the capacitor, and not radiate through any gap in the shield enclosure required to pass the connector across the zone boundary. The equivalent electrical circuit is shown in FIG. 1a when a resistor is used for the impedance element and in FIG. 1b when an inductor is used for the impedance element.

Initial implementations of such shielded connectors involved the passage of suitable electrical connector through a hole drilled in the metal wall, and the connection of discrete capacitors and resistors at each end of the connector.

Later approaches included the development of integral filter connectors comprising a typically cylindrical metal sheath filled with a high dielectric material through which a conductor is passed axially. Thus, capacitance is created radially outward from the filter conductor to the metal sheath. Any required resistance element was obtained by constructing the conductor out of material of suitable resistivity. An inductive element was implemented by forming the filter conductor in a helical coil about the axis of the metal sheath.

When the connector was inserted into a hole drilled through the wall, a metal sheath remained in relatively continuous conductive contact with the wall through which it was passed. Thus the capacitance extending radially outward from the conductor to the sheath effectively extended to electrical ground through the RFI enclosure. The exposed end of the filter conductor were directly soldered to the conductive traces at which the signal to be passed appeared.

While such implementations were effective, they were impractical from a manufacturing point of view, because the process was labour intensive and not susceptible to automation. Moreover, such implementations required significant amounts of space, which is, as discussed above, typically at a premium. Furthermore, because such implementations were not planar, the top piece of the enclosure could not conveniently be removed and replaced as required, because of the connections between the filter connector and the conductive traces. Accordingly, an alternative planar method of implementing a shielded connector more conducive to commercial manufacturing methods was required.

One attempt to implement a planar shielded connector involved the modification of the PCB to create a conductive buried layer interior to the PCB and parallel to its planar surface. The buried layer would typically pass under a zone boundary and its layout would be dependent upon the location of the signal to be passed. The buried layer would not intersect with any of the vias drilled through the printed circuit board, nor with the holes through which the leads of the various integrated circuit components would extend.

To access this buried layer, additional connector vias were drilled partially through the PCB and terminating in the buried layer. There would be typically two connector vias one on each side of the zone boundary proximate to the conductive trace from or to which the signal to be passed appeared. A discrete impedance element was soldered between the conductive trace and the conductor via and a discrete capacitor was soldered between the connector via and the via at the zone boundary.

The interposition of the capacitor between the connector via and the boundary via and of an impedance element between the connector via and the signal trace created on either side of the boundary, a low pass filter equivalent to one of the circuits shown in FIGS. 1a and 1b.

This approach, however, suffers from a number of disadvantages. First, it requires an additional and expensive doping step in the manufacture of the PCB to permit the deposition of the buried layer. Second, design rules relating to such structures typically require, for reasons of accurate registration, that the length of the capacitor lead soldered to the boundary via to exceed a certain minimum distance. The physical distance between the capacitor and the connector the boundary via deleteriously impacts the effectiveness of the filtering obtained using this approach in two respects.

First, with high frequency EMI components, the wavelength will correspondingly be very small. Accordingly, the mechanical distance of the capacitor lead may represent a significant fraction or number of wavelengths of the EMI, and a parasitic inductance along the capacitor lead would be introduced.

This inductance varies in proportion to both the frequency of the EMI component and the length of the capacitor lead. As the parasitic inductance is increased, the capacitance needs to correspondingly be reduced in order to achieve the desired effective frequency of the filter.

However, as the capacitance is decreased, the effective filter bandwidth is similarly decreased, as is the degree of attenuation of the EMI sought to be suppressed. Thus, in order to obtain in excess of 20 dB of attenuation, series resonant components need to be chosen.

Second, the length of the conductor between the capacitor and the EMI shield enclosure (including the top boundary strip 12) constitutes a conductor which is not shielded by the EMI shield enclosure, as it lies physically beyond the low pass filter structure. As this distance is increased, the possibility of EMI emanating along this conductor is also increased, with a corresponding degradation in shielding performance.

SUMMARY OF THE INVENTION

It is an object of the present invention therefore, to minimize the distance between the capacitive element of a shielded connector and the EMI shield enclosure, so as to minimize the possibility and magnitude of any parasitic inductance created and thus permit the use of a large capacitance, in turn maximizing the filter bandwidth at high frequencies.

It is a further object of the present invention, to minimize the distance between the capacitive element of a shielded connector and the EMI shield enclosure, so as to minimize the amount of circuitry which lies beyond the filtering structure.

It is a further object of the present invention to implement a shielded connector in a surface mounted structure, which is conducive to manufacture by simple and cost-effective processes.

It is a further object of the present invention to implement a shielded connector in a physically small design.

According to one aspect, the present invention provides an electrical connection between at least a first electrical component disposed at one side of an electro-magnetic radiation shield wall and at least a second electrical component disposed at the other side of the shield wall, the first electrical component being mounted on a substrate, the electrical connection comprising a cylindrical filter connector disposed at a location under an end of the shield wall, the filter connector having a central conductor connected at opposite ends to the first and second electrical components, a layer of high dielectric material around the central conductor, upper and lower conductors provided on the layer of high dielectric material, an electrically conductive, resilient gasket sandwiched between the end of the shield wall and the upper conductor and the lower conductor being in contact with an electrical conductor on the substrate.

According to another aspect, the present invention provides an electrical connection between at least a first electrical component disposed at one side of an electro-magnetic radiation shield wall and at least a second electrical component disposed at the other side of the shield wall, the first electrical component being mounted on a substrate, the electrical connection comprising a planar filter connector disposed at a location under an end of the shield wall, the planar filter connector having at least one central conductor connected at opposite ends to the first and second electrical components, a layer of high dielectric material disposed above and below the central conductor and an upper conductor and a lower conductor defining two outermost layers, an electrically conductive, resilient gasket sandwiched between the end of the shield wall and the upper conductor and the conductor layer being in contact with an electrical conductor on the substrate.

According to yet another aspect, the present invention provides a shielded electrical apparatus comprising: a first metallic shield portion formed as a box with an open top defined by a perimeter surface; a second metallic shield portion formed as an inverted box with an open bottom defined by a perimeter surface, the first and second boxes being complementary and aligned with the second box above the first box; a first electrically conductive, resilient gasket in contact with the perimeter surface of the first box, and surrounding its open top; a second electrically conductive, resilient gasket in contact with the perimeter surface of the second box, and surrounding its open bottom; a substrate carrying at least one electrical component and having at least a portion sandwiched between the first and second gaskets, the substrate having metal contacts on both surfaces aligned and in contact with the gaskets, the metal contacts on one surface being electrically connected through the substrate with aligned metal contacts on the other surface; and at least one planar filter connector having an upper and a lower metallic conductor disposed above and below at least one central electrical conductor and separated therefrom by a high dielectric material, the filter connector being inserted between the second gasket and the substrate, wherein one of the metallic conductors is in contact with the second gasket and the other metallic conductor is in contact with a metal contact on the substrate, the central conductor being connected at one end to the at least one electrical component and being connectable at the other end to another electrical component outside the shielded apparatus.

According to still another aspect, the present invention provides a shielded electrical apparatus comprising: a first metallic shield portion formed as a box, with an open top defined by a first perimeter wall and a first internal wall; a second metallic shield portion formed as an inverted box with an open bottom defined by a second perimeter wall and a second internal wall; the first perimeter wall and first internal wall being complementary with and aligned with the second perimeter wall and second internal wall, respectively, such that the first and second metallic shield portions together form an enclosure having at least two distinct internal shield zones; a first electrical conductive, resilient gasket in contact with a free end of the first perimeter wall and the first internal wall and surrounding the open top and the two internal zones; a second electrical conductive, resilient gasket in contact with a free end of the second perimeter wall and the second internal wall and surrounding the open bottom and the two internal zones; a substrate sandwiched between the first and second gaskets and carrying at least one electrical component in each internal zone, the substrate having metal contacts on both surfaces aligned and in contact with the gaskets, the metal contacts on one surface being electrically connected through the substrate with aligned metal contacts on the other surface; and at least one planar filter connector having an upper and a lower metallic conductor disposed above and below at least one central electrical conductor, the filter connector being inserted between the second gasket and the substrate at a location beneath the second internal wall, wherein one of the metallic conductors is in contact with the second gasket and the other metallic conductor is in contact with a metal contact on the substrate, the central conductor being connected at one end to the at least one electrical component in one of the two internal zones and being connected at another end to the at least one electrical component in the other internal zone.

According to a further aspect, the present invention provides a planar filter connector comprising: at least one central conductor; a layer of high dielectric material disposed above and below the central conductor; an upper conductor and a lower conductor defining two outermost layers; and contact means provided at opposite ends of the central conductor for connection to respective electrical components.

BRIEF DESCRIPTION OF THE DRAWINGS

The preferred embodiment of the present invention will now be described with reference to the accompanying drawings in which:

FIG. 5 is a fragmentary view of the assembled enclosure and filter connector looking in the direction of arrow V in FIG. 3 but employing the multiple connector package of FIG. 4a.

DETAILED DESCRIPTION OF THE PREFERRED EMBODIMENT

Figure 2:
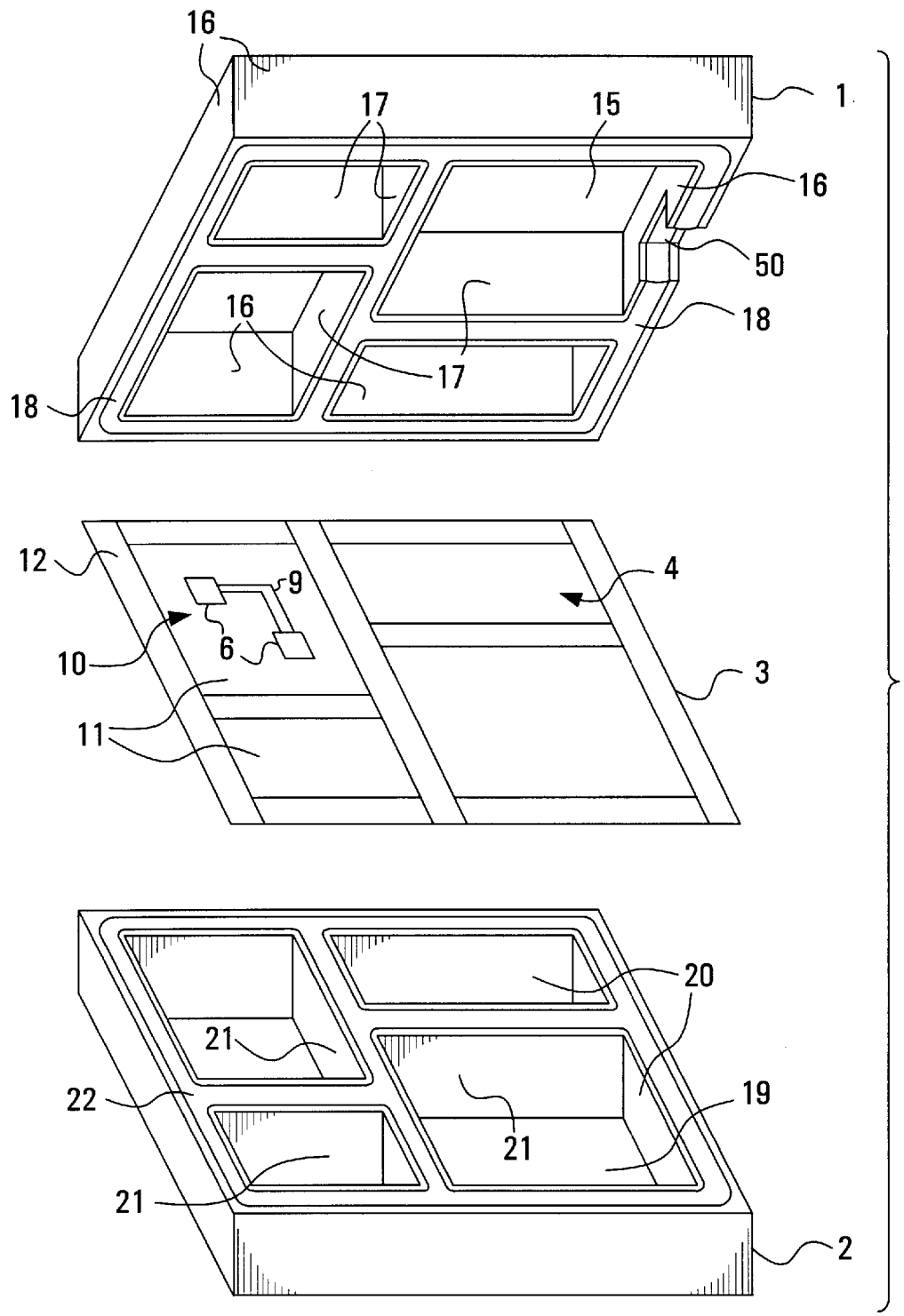
FIG. 2 is an exploded perspective rendering of a printed circuit board and its corresponding EMI shield enclosure constructed according to the invention.

Referring now to FIG. 2, a Faraday shield for EMI consists of a metal enclosure composed of two pieces, namely a top case 1 and a bottom case 2, designed to surround a printed circuit board 3 from above and below respectively.

Figure 3:
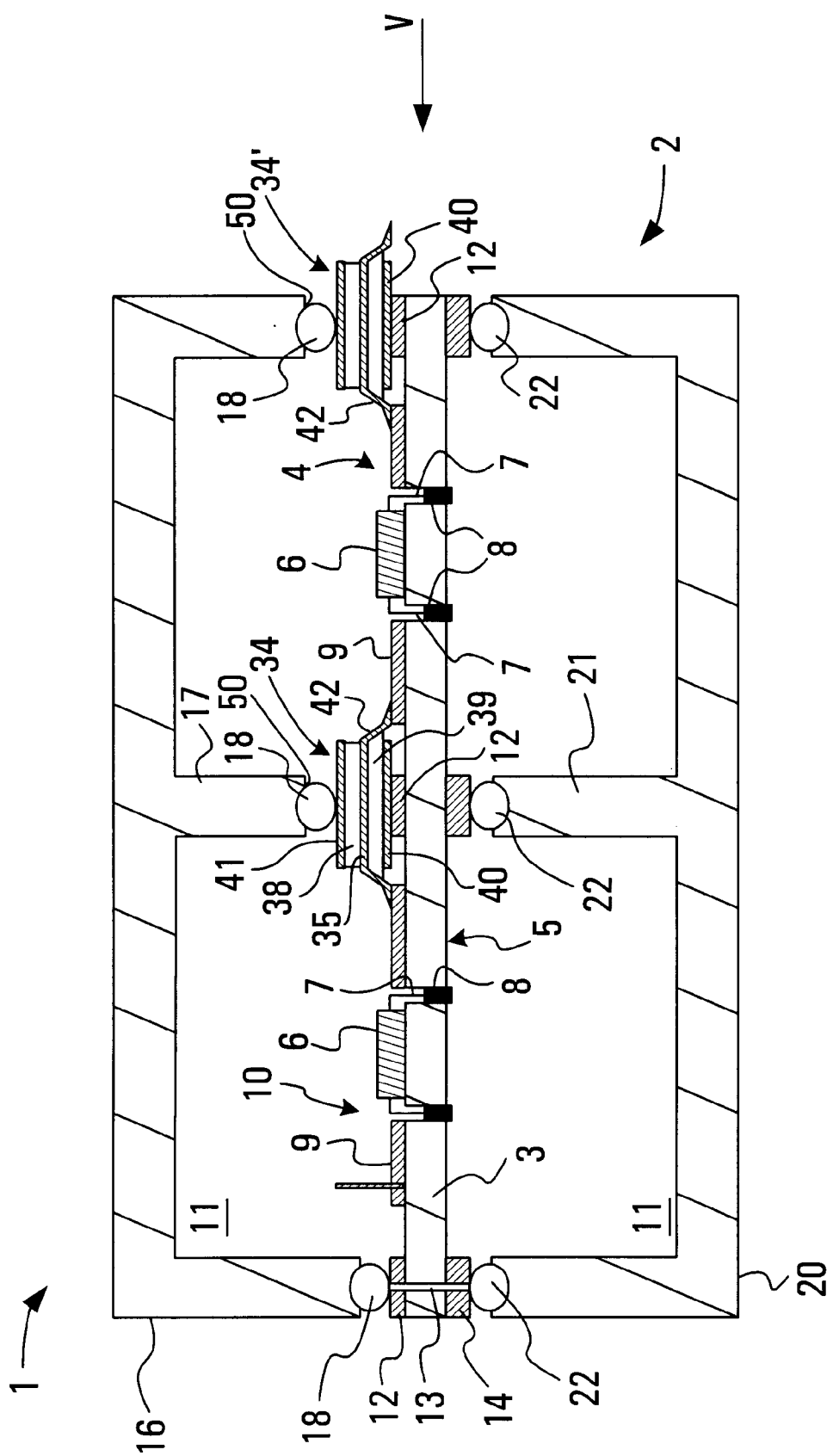
FIG. 3 is a schematic sectional view drawn to a larger scale, of the assembled enclosure shown in FIG. 2, with the addition of a filter connector according to the present invention.

Referring additionally to FIG. 3, the printed circuit board 3 has two planar surfaces. One of these, designated the PCB top face 4, has mounted upon it a plurality of discrete integrated circuit components 6, from each of which extend a plurality of metal leads 7 which pass through metal coated vias 8 drilled in the printed circuit board 3. The various integrated circuit components 6 on the PCB top face 4 are interconnected by a plurality of conductive traces 9 applied to the PCB top face 4.

The combination of the integrated circuit components 6 and the conductive traces 9, which are electrically connected to the various leads 7 of the integrated circuit components 6, are organized into a plurality of electrical circuits 10. The PCB top face 4 is typically divided into a plurality of geographic zones 11, such that circuits 10 to be isolated by the shielding mechanism from one another are located in different zones 11. The perimeter of each zone 11, which may include a portion of the perimeter of the PCB top face 4, is delineated by a mating series of metallized planar top boundary strips 12 deposited on the PCB top face 4. The top boundary strips 12 are of a constant width.

A substantially equally spaced series of boundary metal coated vias 13 (not shown in FIG. 2) are drilled through the top boundary strips 12 and the printed circuit board 3.

The obverse planar surface of the printed circuit board 3, is designated the PCB bottom face 5, and is similarly divided into zones 11 the layout of which is the mirror image of the layout of the zones 11 on the PCB top face 4. The perimeter of each zone 11, on the PCB bottom face 5 is delineated by a mating series of metallized planar bottom boundary strips 14 deposited on the PCB bottom face 5, having a constant width which is substantially equal to the width of the top boundary strips 12. The boundary vias 13 drilled through the top boundary strips 12 and the printed circuit board 3, also extend through the bottom boundary strips 14.

Referring again to FIG. 2, the top case 1 is composed of a planar top case face 15 of substantially the same dimensions as the dimensions of the PCB top face 4, surrounded by a plurality of mating, integral top case walls 16 about the perimeter of the top case face 15. The top case walls 16 extend below the top case face 15 and are of constant height, sufficient to provide clearance for the integrated circuit components 6 mounted on the PCB top face 4 when the top case walls 16 are placed over the printed circuit board 3. The walls 16 may be notched along the bottom edge to accommodate filter connectors as described hereinafter. An exemplary such notch 50 is illustrated.

A plurality of integral interior top case walls 17 extend below the top case face 15 and have a constant height which is substantially equal to the height of the top case walls 16. The layout of the top case walls 16 and 17 corresponds to the layout of the top boundary strips 12 on the PCB top face 4. As with the walls 16 the interior walls 17 may be notched to accommodate filter connectors but no such notches are illustrated in FIG. 2.

The bottom case 2 is similarly composed of a planar bottom case face 19 of substantially the same dimensions as the dimensions of the PCB bottom face 5, surrounded by a plurality of mating, integral bottom case walls 20 about the perimeter of the bottom case face 19. The bottom case walls 20 extend above the bottom case face 19 and are of constant height, sufficient to provide clearance for the soldered connections between the leads 7 of the integrated circuit components 6 and the component vias 8 through which they extend when the printed circuit board 3 is placed over the bottom case walls 20.

A plurality of integral interior bottom case walls 21, extend above the bottom case face 19 and have a constant height, substantially equal to the height of the bottom case walls 20. The layout of the bottom case walls 20 and 21 corresponds to the layout of the bottom boundary strips 14 on the PCB bottom face 5.

As is more clearly shown in FIG. 3, the width of each of the top case walls 16 and 17 is substantially equal to the width of the top boundary strips 12. An elastically resilient electrically conductive rope top gasket 18 is affixed in a groove provided in the exposed edges of each of the top case walls 16 and 17. When the top case 1 is placed over the PCB top face 4, such that the exterior perimeter of the top case 1 and PCB top face 4 coincide, the top gasket 18 comes into substantially continuous electrical contact with each of the top boundary strips 12.

Where there is a notch 50 in a wall 16 or 17 the gasket continues into the notch but at that location the gasket does not contact the boundary strip 12. Instead, a gap is left to accommodate a gasket filter as described hereinafter.

The width of each of the bottom case walls 20 and 21 is substantially equal to the width of the bottom boundary strips 14. An elastically resilient electrically conductive rope bottom gasket 22 is affixed in a groove provided on the exposed edges of each of the bottom case walls 20 and 21. When the printed circuit board 3 is placed over the bottom face 2, such that the exterior perimeter of the PCB bottom face 5 and the bottom case 2 coincide, the bottom gasket 22 comes into substantially continuous electrical contact with each of the bottom boundary strips 14.

The effect of this enclosure system is to provide an effectively continuous electrically conductive enclosure about each of the circuits 10 delineated by the zones 11. The spacing between consecutive boundary vias 13 along the top boundary strip 12, and the separation between the effectively parallel tracks of boundary vias 13 is such as to permit a relatively continuous shield between zones 11, notwithstanding that there is in reality only spatially intermittent contact between, serially, the top case wall 17, the top gasket 18, the top boundary strip 12, the bottom boundary strip 14, the bottom gasket 22 and the bottom case baffle 21 at each boundary between two zones 11. Similarly, along the perimeter of the printed circuit board 3, there is established a relatively continuous shield, through the spatially intermittent contact between, serially, the top case wall 16, the top gasket 18, the top boundary strip 12, the bottom boundary strip 14, the bottom gasket 22 and the bottom case wall 20.

In accordance with the invention surface mounted gasket filters 32 provide interconnections between two interior circuits 10 or provide interconnections between an interior circuit 10 and electrical circuitry outside the enclosure system.

FIG. 3 illustrates an example of such an interior gasket filter 34 as well as such an exterior gasket filter 34'.

Each gasket filter 34, 34' is formed substantially of planar layers, a middle layer being a metal conductor layer 35. Deposited on an upper planar surface of the conductor layer 35 is an upper layer 38 of high dielectric material and deposited on a lower planar surface of the conductor layer 35 is a lower layer 39 of high dielectric material. A lower metallization layer 40 is deposited on a lower planar surface of the lower dielectric layer 39 and an upper metallization layer 41 is deposited on an upper planar surface of the upper dielectric layer 38.

Each gasket filter 34, 34' is positioned between the upper gasket 18 and the top boundary strip 12 in a notch 50 (see particularly FIG. 5) in wall 17 which permits interconnection between two interior circuits 10 in the case of the interior gasket filter 34 or in a notch 50 in the wall 16 which permits interconnection between an interior circuit 10 and an external circuit in the case of an exterior gasket filter 34'. In each case the lower metallization layer 40 of the gasket filter 34 lies above and is in substantially continuous electrical contact with the top boundary strip 12 at a location between vias 13. The upper metallization layer 41, on the other hand, lies below and is in substantially continuous electrical contact with the top gasket 18 which conforms to the shape of the gasket filter by being compressed at the location of the gasket filter. Interconnection between two interior circuits 10 or an interior circuit 10 and an exterior circuit is achieved by interconnecting the conductor 35 to a conductor trace 9 by means of leads 42 which are soldered to the conductor trace 9 or an external conductor (not shown).

The characteristics of the gasket filter 34 are determined by the properties and shapes of the various layers. Typically, a capacitance is set up, in a direction perpendicular to the plane of the PCB top face 4, between the upper metallization layer 41 and the gasket filter conductor 35, and between the gasket filter conductor 35 and the lower metallization layer 40, across the intervening upper dielectric layer 38 and the lower dielectric layer 39 respectively.

Figure 1A:
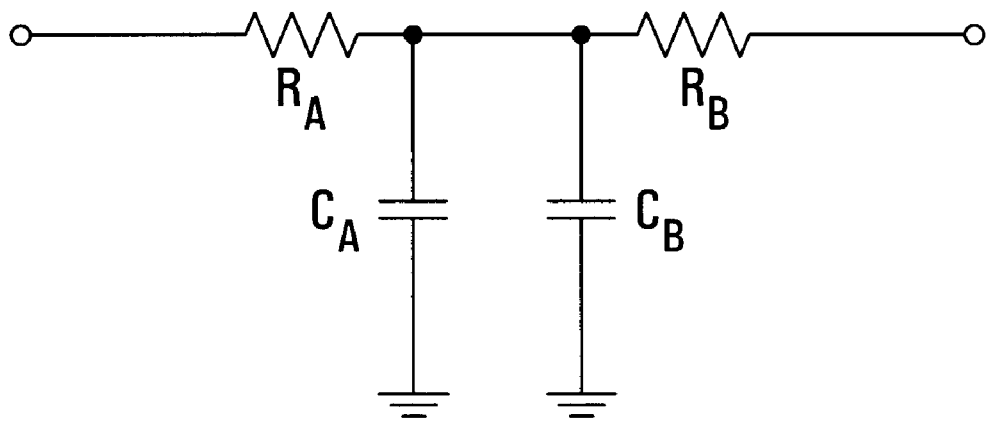
FIG. 1a is a circuit diagram showing an equivalent circuit to a shielded connector, where a resistor is used for the impedance element.
Figure 1B:
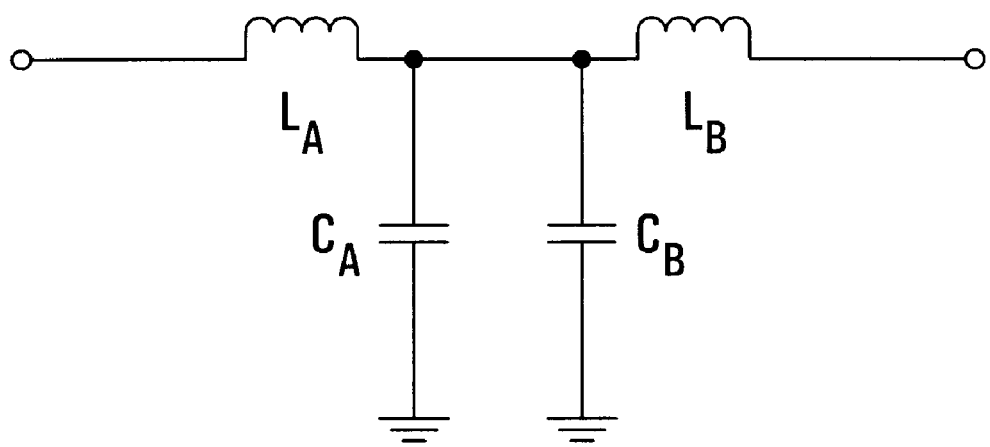
FIG. 1b is a circuit diagram showing an equivalent circuit to a shielded connector, where an inductor is used for the impedance element.

The creation of this capacitance and the inherent impedance within the gasket filter conductor 35, creates, on either side of the boundary across which the signal is to be passed, an effective low-pass filter equivalent to one of the circuits shown in FIGS. 1a and 1b which, using appropriate values for the capacitance and the impedance of conductor 35, prevents the transmission of the unwanted RF EMI along the gasket filter 34 and across the boundary, as described above.

Typically, the top case 1 and the bottom case 2 are electrically grounded, with the result that the upper metallization layer 41 and the lower metallization layer 40 will also typically be electrically grounded.

The present invention discloses numerous advantages over the prior art. The primary advantages relate to filtering performance.

First, because there is effectively zero distance between the capacitance set up within the gasket filter 34 and the EMI shield enclosure, there is a greatly reduced risk of introducing a parasitic inductance. Accordingly, very large capacitances may be used in the gasket filter 34, with a correspondingly broad filter bandwidth and relatively uniform filtering performance across the frequency band of interest.

Second, again because there is effectively zero distance between the capacitance set up within the gasket filter 34 and the EMI shield enclosure, there is no conductor exposed beyond the gasket filter 34 which may possibly radiate EMI beyond the shield enclosure.

Other advantages of the present invention over the prior art relate to cost and ease of manufacturing and assembly. First, only minor modification is required to the top case 1 by providing the notch or notches. In some cases, if the gasket filters 34, 34' are made thin enough, it might be possible to dispense with the notches, the resilient gasket 18 being compressible sufficiently to accommodate the gasket filters. Second, no modification is required to the printed circuit board 3. Third, manufacture of the gasket filter may be accomplished by known technology and processes used in the manufacture of ceramic capacitors. Fourth, the manufacture of the gasket filter is very cost-effective. Fifth, assembly of the EMI shield enclosure is simple, and may be accomplished by automated means.

While the preferred embodiment of the present invention has been described and illustrated it will be apparent to one skilled in the art that variations in the design may be made.

Figure 4A:
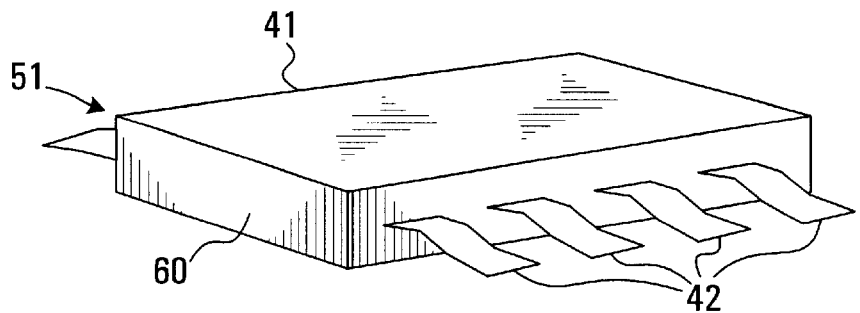
FIG. 4a is a perspective view of a multiple connector package with leads.
Figure 4B:
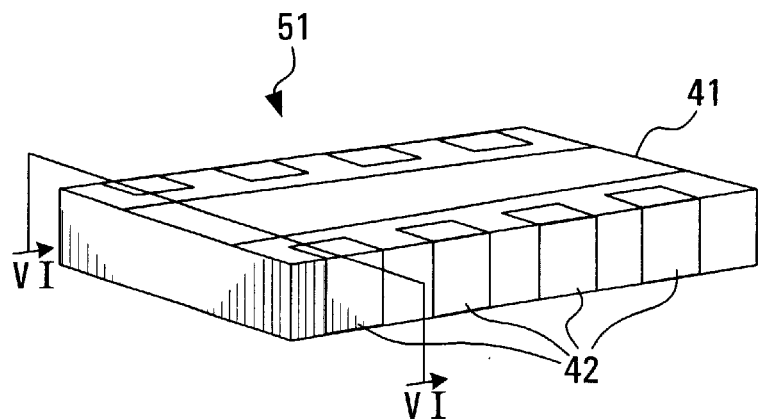
FIG. 4b is a perspective view of a multiple connector package without leads.
Figure 5:
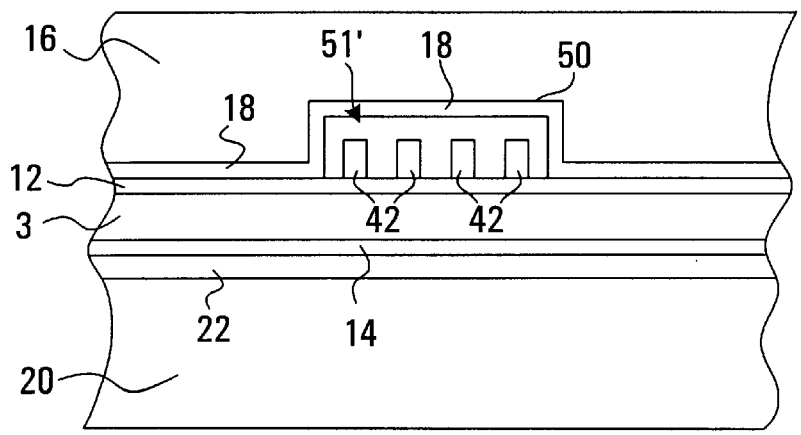

For example, where there are a plurality of signals to be passed from one zone to another across the same zone boundary, a multi-connector package 51 of gasket filters 34 may be implemented as shown in FIGS. 4a and 5. In this case there are shown four leads 42 extending from four side by side gasket filters 34 making up the multi-connector package 51, each lead 42 extending from a respective conductor layer 35 not visible in FIGS. 4a and 5 because layers 35 are internal of package 51. The package 51' may be configured without external leads, as exemplified in FIG. 4b. In this case, four spaced contacts 42' are provided along each opposite longitudinal edge and the upper and lower metallization layers (only upper layer 41' being visible) stop short of the longitudinal edge.

In addition, depending upon the anticipated frequency range of the EMI to be shielded, the capacitive link between the upper metallization layer 41 and the gasket filter conductor 35 and between the gasket filter conductor 35 and the lower metallization layer 40 may not provide acceptable shielding performance. In such a situation, a direct conductive connection between the upper metallization layer 41 and the lower metallization layer could be implemented which would not intersect with the gasket filter conductor 35, to provide the requisite conductance.

It will be apparent to a person skilled in the art that for the purposes for which the gasket filter connector is intended, the capacitance which is established across the connector need not be oriented in a vertical fashion, nor does the capacitance need to be aligned in a consistent direction throughout. Accordingly, the enclosure system described in the present invention could achieve the desired objectives by use of a cylindrical gasket filter connector comprising a cylindrical outer metal sheath, filled with high dielectric material and through which the gasket filter conductor passes axially. Such a connector is known in the prior art, as described above but not in combination with the enclosure whereby the connector sits on the PCB top face 4 rather than passing through the top case wall 17. Using a cylindrical filter connector instead of a planar filter connector the arrangement depicted in FIG. 3 would still be accurate. However, the elements depicted as 40 and 41 in FIG. 3 would represent upper and lower portions of a cylindrical outer conductor of a cylindrical filter connector, the element depicted as 35 would represent a central conductor of the cylindrical filter connector and the elements depicted as 38 and 39 would represent different portions of a cylindrical layer of high dielectric material.

Moreover, although FIG. 3 illustrates the gasket filters as having only three metallized layers 35, 40 and 41, in practice an interdigitated arrangement of layers may be provided to provide greater capacitance. See, for example, FIG. 6 which is a cross-sectional view taken on lines VI—VI of FIG. 4b.

Figure 6:
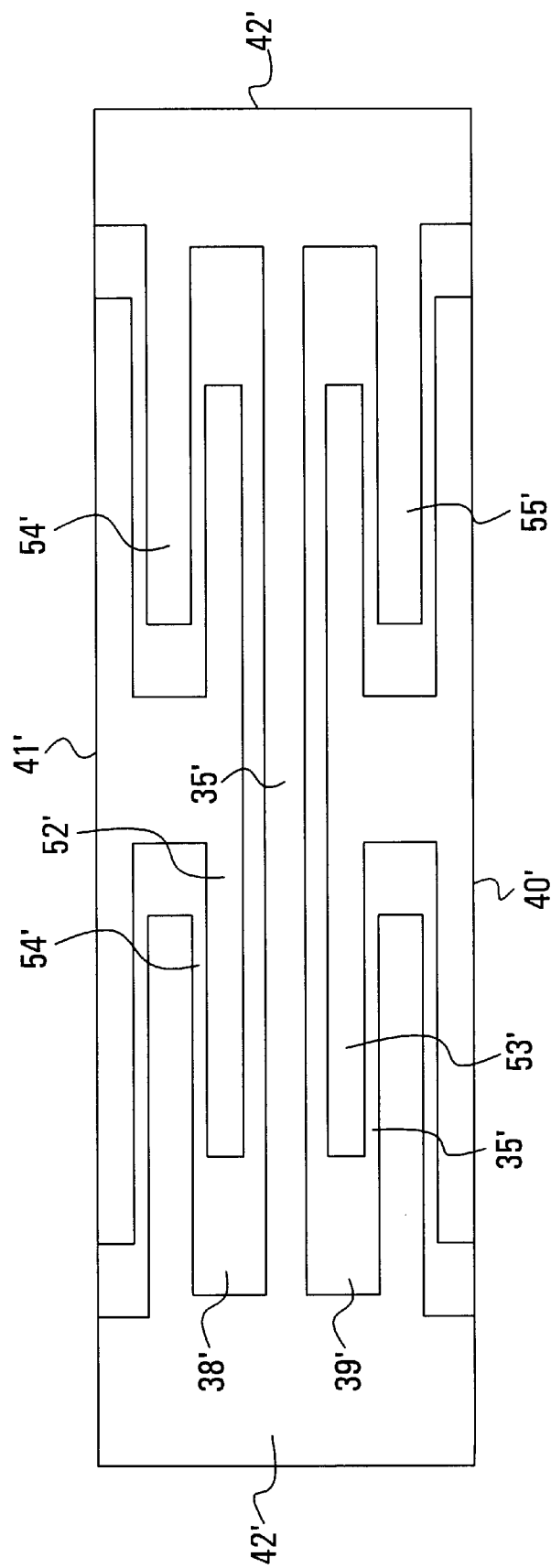
FIG. 6 is a cross-sectional view taken on line VI—VI of the multiple connector package of FIG. 4b but drawn to a larger scale.

In the FIG. 6 embodiment, the upper metallization layer 41' is electrically connected to a parallel metal layer 52' and the lower metallization layer is electrically connected to a parallel metal layer 53'. The metal conductive layer 35' is interconnected electrically through the spaced contacts 42' to two coplanar metal layers 54' and two coplanar metal layers 55'. In order from top to bottom are layer 41', layers 54', layer 52', layer 35', layer 53', layers 55' and layer 40'. Upper and lower dielectric layers 38' and 39' are effectively subdivided into sub-layers which fill in the spaces between the various metal layers.

With such an interdigital structure, the capacitance thus created is greatly increased, as the amount of capacitance established between two metal surfaces surrounding a dielectric layer is directly proportional to the surface area of the metal surfaces between which the dielectric layer passes.

I claim:

1. An electrical connection between at least a first electrical component disposed at one side of an electro-magnetic radiation shield wall and at least a second electrical component disposed at the other side of the shield wall, the first electrical component being mounted on a substrate, the electrical connection comprising a cylindrical filter connector disposed at a location under an end of the shield wall, the filter connector having a central conductor connected at opposite ends to the first and second electrical components, a cylindrical layer of high dielectric material around the central conductor, a cylindrical outer conductor provided on the layer of high dielectric material, an electrically conductive, resilient gasket sandwiched between and making electrical contact with the end of the shield wall and a first portion of the cylindrical conductor and a second portion of the cylindrical conductor being in contact with an electrical conductor on the substrate.

2. An electrical connection between at least a first electrical component disposed at one side of an electro-magnetic radiation shield wall and at least a second electrical component disposed at the other side of the shield wall, the first electrical component being mounted on a substrate, the electrical connection comprising a planar filter connector disposed at a location under an end of the shield wall, the planar filter connector having at least one central conductor connected at opposite ends to the first and second electrical components, a layer of high dielectric material disposed above and below the central conductor and an upper conductor and a lower conductor defining two outermost layers, an electrically conductive, resilient gasket sandwiched between and making electrical contact with the end of the shield wall and the upper conductor and the lower conductor being in contact with an electrical conductor on the substrate.

3. An electrical connection according to claim 2, wherein the planar filter connector is accommodated in a notch in the end of the shield wall.

4. An electrical connection according to claim 3, wherein there is a plurality of first electrical components and a plurality of second electrical components and the planar filter connector has a plurality of coplanar central conductors each connected at one end to a respective one of the plurality of first electrical components and connected at an opposite end to a respective one of the plurality of second electrical components.

5. An electrical connection according to claim 3, wherein the central conductor comprises a plurality of interconnected layers, the upper conductor comprises a plurality of interconnected layers and the lower conductor comprises a plurality of interconnected layers, the layers of the central conductor interdigitating with the layers of the upper conductor and the layers of the lower conductor, spaces between the interdigitated layers being filled with high dielectric material.

6. An electrical connection according to claim 2, wherein the central conductor comprises a plurality of interconnected layers, the upper conductor comprises a plurality of interconnected layers and the lower conductor comprises a plurality of interconnected layers, the layers of the central conductor interdigitating with the layers of the upper conductor and the layers of the lower conductor, spaces between the interdigitated layers being filled with high dielectric material.

7. An electrical connection according to claim 2, wherein there is a plurality of first electrical components and a plurality of second electrical components and the planar filter connector has a plurality of coplanar central conductors each connected at one end to a respective one of the plurality of first electrical components and connected at an opposite end to a respective one of the plurality of second electrical components.

8. An electrical connection according to claim 7, wherein each central conductor comprises a plurality of interconnected layers, the upper conductor comprises a plurality of interconnected layers and the lower conductor comprises a plurality of interconnected layers, the layers of the central conductor interdigitating with the layers of the upper conductor and the layers of the lower conductor, spaces between the interdigitated layers being filled with high dielectric material.

9. An electrical connection according to claim 8, wherein each central conductor is provided with a pair of oppositely extending leads.

10. An electrical connection according to claim 8, wherein each central conductor is provided with a pair of opposite leadless contacts.

11. A shielded electrical apparatus comprising:
a first metallic shield portion formed as a box with an open top defined by a perimeter surface;
a second metallic shield portion formed as an inverted box with an open bottom defined by a perimeter surface, the first and second boxes being complementary and aligned with the second box above the first box;
a first electrically conductive, resilient gasket in contact with the perimeter surface of the first box, and surrounding its open top;
a second electrically conductive, resilient gasket in contact with the perimeter surface of the second box, and surrounding its open bottom;
a substrate carrying at least one electrical component and having at least a portion sandwiched between the first and second gaskets, the substrate having metal contacts on both surfaces aligned and in contact with the gaskets, the metal contacts on one surface being electrically connected through the substrate with aligned metal contacts on the other surface; and
at least one planar filter connector having an upper and a lower metallic conductor disposed above and below at least one central electrical conductor and separated therefrom by a high dielectric material, the filter connector being inserted between the second gasket and the substrate, wherein one of the metallic conductors is in contact with the second gasket and the other metallic conductor is in contact with a metal contact on the substrate, the central conductor being connected at one end to the at least one electrical component and being connectable at the other end to another electrical component outside the shielded apparatus.

12. A shielded electrical apparatus according to claim 11, wherein the planar filter connector is accommodated in a notch in the perimeter surface of the second box.

13. A shielded electrical apparatus according to claim 12, wherein the planar filter connector has a plurality of coplanar central conductors each connected at one end to an electrical component on the substrate and connected at another end to an electrical component outside the shielded apparatus.

14. A shielded electrical apparatus according to claim 13, wherein each central conductor comprises a plurality of interconnected layers, the upper conductor comprises a plurality of interconnected layers and the lower conductor comprises a plurality of interconnected layers, the layers of the central conductor interdigitating with the layers of the upper conductor and the layers of the lower conductor, spaces between the interdigitated layers being filled with high dielectric material.

15. A shielded electrical apparatus comprising:
a first metallic shield portion formed as a box, with an open top defined by a first perimeter wall and a first internal wall;
a second metallic shield portion formed as an inverted box with an open bottom defined by a second perimeter wall and a second internal wall;
the first perimeter wall and first internal wall being complementary with and aligned with the second perimeter wall and second internal wall, respectively, such that the first and second metallic shield portions together form an enclosure having at least two distinct internal shield zones;
a first electrical conductive, resilient gasket in contact with a free end of the first perimeter wall and the first internal wall and surrounding the open top and the two internal zones;

a second electrical conductive, resilient gasket in contact with a free end of the second perimeter wall and the second internal wall and surrounding the open bottom and the two internal zones;

a substrate sandwiched between the first and second gaskets and carrying at least one electrical component in each internal zone, the substrate having metal contacts on both surfaces aligned and in contact with the gaskets, the metal contacts on one surface being electrically connected through the substrate with aligned metal contacts on the other surface; and at least one planar filter connector having an upper and a lower metallic conductor disposed above and below at least one central electrical conductor, the filter connector being inserted between the second gasket and the substrate at a location beneath the second internal wall, wherein one of the metallic conductors is in contact with the second gasket and the other metallic conductor is in contact with a metal contact on the substrate, the central conductor being connected at one end to the at least one electrical component in one of the two internal zones and being connected at another end to the at least one electrical component in the other internal zone.

16. A shielded electrical apparatus according to claim 15, wherein the planar filter connector is accommodated in a notch in the free end of the second internal wall.

17. A shielded electrical apparatus according to claim 16, wherein the planar filter connector has a plurality of coplanar central conductors each connected at one end to an electrical component in one of the two internal zones and connected at another end to an electrical component in the other internal zone.

18. A shielded electrical apparatus according to claim 17, wherein each central conductor comprises a plurality of interconnected layers, the upper conductor comprises a plurality of interconnected layers and the lower conductor comprises a plurality of interconnected layers, the layers of the central conductor interdigitating with the layers of the upper conductor and the layers of the lower conductor, spaces between the interdigitated layers being filled with high dielectric material.

* * * * *